United States Patent
Takasaki et al.

(10) Patent No.: US 9,491,883 B2
(45) Date of Patent: Nov. 8, 2016

(54) CONNECTOR WITH EJECTOR MECHANISM REINFORCEMENT

(71) Applicant: Molex, LLC, Lisle, IL (US)

(72) Inventors: Masamitsu Takasaki, Yamato (JP);
Kyoko Motohashi, Yamato (JP);
Shigeru Akiyama, Machida (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/507,965

(22) Filed: Oct. 7, 2014

(65) Prior Publication Data

US 2015/0099383 A1 Apr. 9, 2015

(30) Foreign Application Priority Data

Oct. 7, 2013 (JP) .................................. 2013-210224

(51) Int. Cl.
*H01R 13/62* (2006.01)
*H05K 7/14* (2006.01)

(52) U.S. Cl.
CPC .................................. *H05K 7/1409* (2013.01)

(58) Field of Classification Search
CPC ............... H05K 7/1409; G06K 13/08; H01R 13/65802
USPC ............ 439/607.22, 607.29, 607.31, 607.33, 439/946, 153, 159; 361/679.31, 679.32, 361/679.33, 679.38, 679.58, 679.59, 725, 361/727

See application file for complete search history.

(56) References Cited

U.S. PATENT DOCUMENTS

| | | | | |
|---|---|---|---|---|
| 5,286,207 A | * | 2/1994 | McHugh | G06K 19/077 439/159 |
| 5,713,750 A | * | 2/1998 | Ho | G06K 13/08 439/159 |
| 6,109,941 A | * | 8/2000 | Koseki | G06K 13/08 439/159 |
| 6,210,187 B1 | * | 4/2001 | Tung | H01R 13/6335 439/159 |
| 6,319,028 B1 | * | 11/2001 | Zhang | H05K 5/0295 439/159 |
| 6,478,590 B1 | * | 11/2002 | Kuo | H01R 13/635 439/159 |

(Continued)

FOREIGN PATENT DOCUMENTS

JP H07-335319 A 12/1995
JP 2002-216905 A 8/2002

*Primary Examiner* — Amy Cohen Johnson
*Assistant Examiner* — Milagros Jeancharles
(74) *Attorney, Agent, or Firm* — James A. O'Malley

(57) ABSTRACT

A connector includes a housing for insertion and ejection of a device, and an ejection mechanism. The ejection mechanism includes a rod member able to slide in the directions of device insertion and ejection. The rod member includes a main body portion extending in the directions of insertion and ejection, an operating piece connected to a protruding end of the main body portion protruding from the housing and extending in a direction intersecting the insert and ejection directions, and a reinforcing portion connected to the main body portion in front of the protruding end in the insertion direction and able to support the operating piece from the front in the insertion direction. The reinforcing portion includes a supporting end able to support the operating piece from the front in the insertion direction. The supporting end extends in a direction intersecting the length direction of the operating piece.

25 Claims, 7 Drawing Sheets

(56) References Cited

U.S. PATENT DOCUMENTS

| | | |
|---|---|---|
| 6,913,492 B2 | 7/2005 | Kuroda et al. |
| 7,040,908 B2 | 5/2006 | Kamata |
| 7,140,894 B2 * | 11/2006 | Tsai ............... H01R 13/629 |
| | | 439/159 |
| 7,927,116 B2 * | 4/2011 | Kestur Nagarajan ........ G06K 13/0806 |
| | | 439/159 |
| 8,197,272 B2 | 6/2012 | Matsunaga |
| 8,597,038 B2 * | 12/2013 | Yokoyama ........ G06K 13/0806 |
| | | 439/160 |
| 8,811,025 B2 | 8/2014 | Kume |
| 2004/0038570 A1 * | 2/2004 | He ................ G06K 13/08 |
| | | 439/159 |
| 2011/0294322 A1 * | 12/2011 | Kikuchi ............. H01R 13/635 |
| | | 439/152 |

* cited by examiner

CONNECTOR WITH EJECTOR MECHANISM REINFORCEMENT

REFERENCE TO RELATED APPLICATIONS

The Present Disclosure claims priority to prior-filed Japanese Patent Application No. 2013-210224, entitled "Connector," filed on 7 Oct. 2013 with the Japanese Patent Office. The content of the aforementioned patent application is incorporated in its entirety herein.

BACKGROUND OF THE PRESENT DISCLOSURE

The Present Disclosure relates, generally, to a connector, and, more particularly, to a connector which prevents deformation of the rod member.

Electronic devices typically include card connectors to allow various types of memory cards to be used. An example of these types of electronic devices is disclosed in Japanese Patent No. 4527877 (Japanese Publication No. 2002-216905; Japanese Application No. 2001-015774), the content of which is hereby incorporated in its entirety herein.

FIG. 7 additionally illustrates these types of connectors. Referring to FIG. 7, 811 is the housing for a connector made of an insulating resin material. An insertion groove portion 818 is formed on both the left and right sides of the housing, and both ends of a card (not shown) are inserted into and held by the insertion groove portions 818. The housing 811 is secured to the surface of a substrate 891. A cover member 861 composed of a metal plate is placed over the housing 811. The cover member 861 is also secured to the surface of the substrate 891.

In the cover member 861, a lever member 821 is pivotally mounted via a shaft 821c. Also, a push rod 822 is mounted on one side of the housing 811 to slide in the insertion and ejection directions of the card; that is, in the insertion and removal directions of the card. An engaging portion 821b formed on one end of the lever member 821 engages an engaging groove 822b in the push rod 822. An abutting portion 821a formed on one end of the lever member 821 also abuts the inserted end of a card inserted into the housing 811.

When a card is removed from the housing 811, the user pushes in the operating portion 822a of the push rod 822, and the push rod 822 slides in the insertion direction of the card. Because the engaging portion 821b of the lever member 821 engaging the engaging groove 822b of the push rod 822 is displaced in the insertion direction of the card and the lever member 821 pivots, the abutting portion 821a of the lever member 821 is displaced in the ejection direction of the card. The card is pushed out by the abutting portion 821a of the lever member 821, and is ejected from the housing 811.

However, in such connectors, the operating portion 822a of the push rod 822 is formed by bending the top of the push rod 822, which is composed of a thin, slender metal band. Therefore, when the overall length of the operating portion 822a is extended in order to make the push rod easier for the user to operate, the tip of the operating portion 822a is subjected to greater operating force during use. A large moment occurs at the base end of the operating portion 822a, that is, the portion connected to the push rod 822, and the operating portion 822a is more likely to bend. When the amount by which the push rod 822 protrudes from the housing 811 is increased to make the push rod easier for the user to operate, the tip of the operating portion 822a is also subjected to greater operating force during use. A large load is applied to the portion of the push rod 822 protruding from the housing 811, and this portion becomes more likely to buckle.

SUMMARY OF THE PRESENT DISCLOSURE

Therefore, it is an object of the Present Disclosure to solve the aforementioned problems by providing a connector which prevents deformation of the rod member in the ejection mechanism, so that the ejection mechanism operates reliably and the ejection of devices remains reliable even when the mechanism is used repeatedly over a long period of time.

In order to achieve this object, the Present Disclosure discloses a connector comprising a housing for insertion and ejection of a device, and an ejection mechanism able to change orientation between a first orientation and a second orientation. The ejection mechanism includes a rod member able to slide in the directions of device insertion and ejection. The rod member includes a main body portion extending in the directions of insertion and ejection, an operating piece connected to a protruding end of the main body portion protruding from the housing and extending in a direction intersecting the insertion and ejection directions, and a reinforcing portion connected to the main body portion in front of the protruding end in the insertion direction and able to support the operating piece from the front in the insertion direction. The reinforcing portion includes a supporting end able to support the operating piece from the front in the insertion direction, the supporting end extending in a direction intersecting the length direction of the operating piece. The amount of protrusion of the protruding end from the housing is greater when the ejection mechanism is in the second orientation than in the first orientation.

In another connector of the Present Disclosure, the supporting end is able to support the middle of the operating piece in the width direction. In still another connector of the Present Disclosure, the supporting end is able to support at least a portion of the operating piece in a range from the middle and towards the front of the operating piece in the length direction. In yet another connector of the Present Disclosure, the reinforcing portion includes a plate-shaped reinforcing main body portion connected to the main body portion, extending in the directions of insertion and ejection, extending in a direction intersecting the directions of insertion and ejection, and extending in a direction intersecting the length direction of the operating piece.

Another connector of the Present Disclosure further comprises a cover member mounted on the housing and covering at least the housing and a portion of a device inserted into the housing, the reinforcing portion including a front end supportable from the front in the insertion direction by the supporting end of the housing and a supporting end of the cover member when the ejection mechanism is in the first orientation, the front end extending in a direction intersecting the direction of extension of the supporting end of the housing and the supporting end of the cover member. In still another connector of the Present Disclosure, the reinforcing portion includes an inner end able to provide support on the outer surface of the main body portion to the front of the reinforcing main body portion in the insertion direction. Another connector of the Present Disclosure further comprises a holding spring portion for holding a device inserted into the housing, the holding spring portion including a holding protrusion portion extending towards the inside in the width direction of the housing, and the device including a holding recessed portion formed in the outer surface, the holding protrusion portion of the holding spring portion engaging the holding recessed portion to hold the device.

The connector of the Present Disclosure prevents deformation of the rod member in the ejection mechanism. Thus, the ejection mechanism operates reliably and the ejection of devices remains reliable even when the mechanism is used repeatedly over a long period of time.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 2:
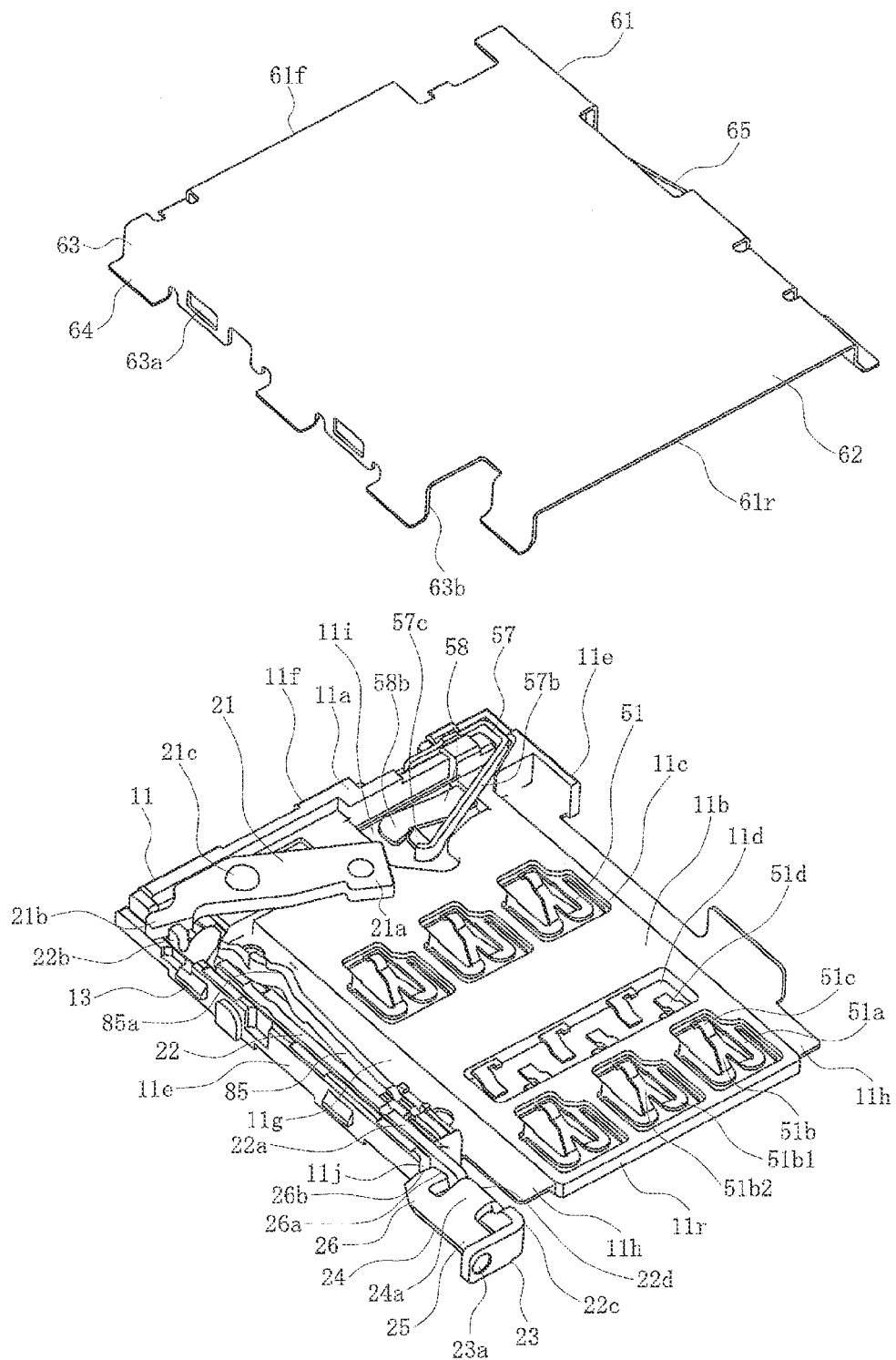
FIG. 2 is an exploded perspective view of the connector of FIG. 1.
Figure 3:
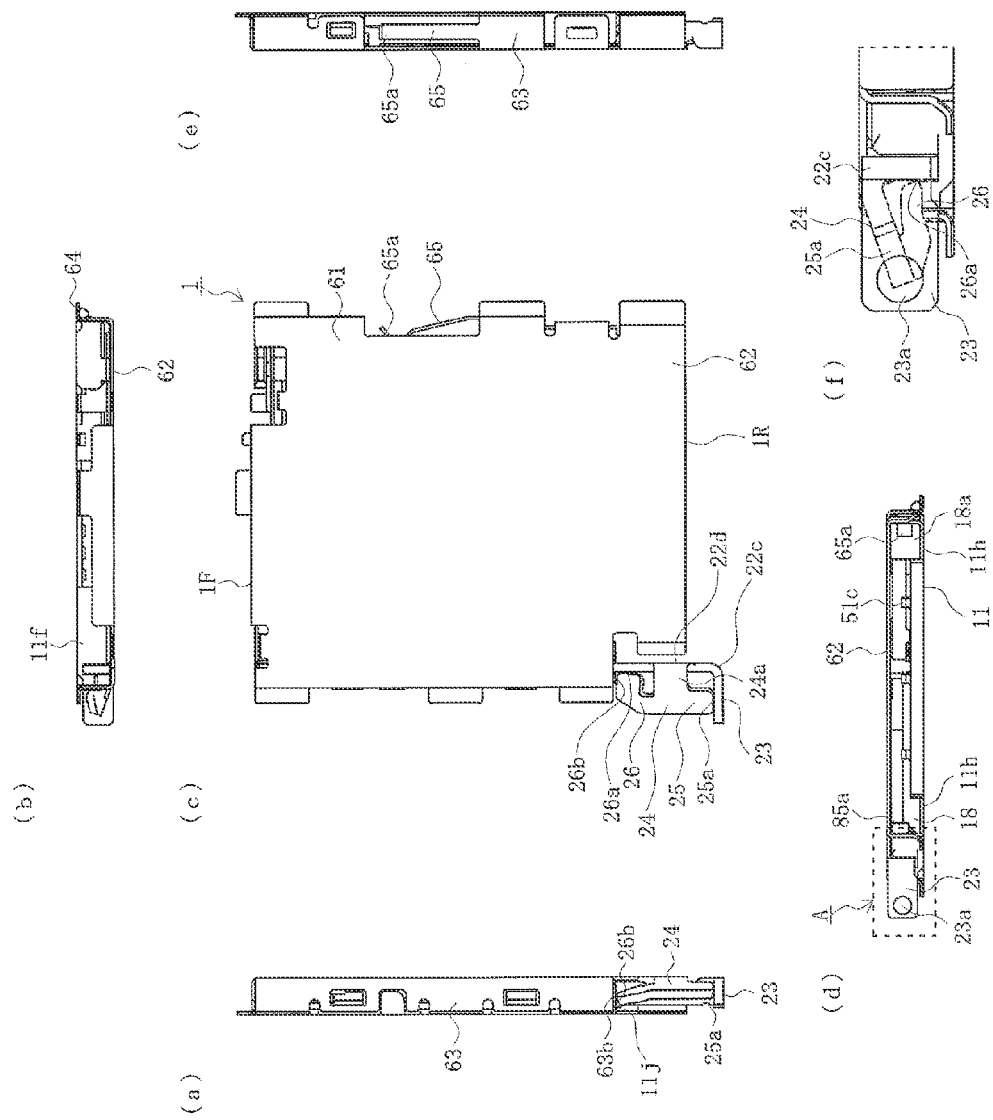
FIG. 3 illustrates five views of the connector of FIG. 1, in which (a) is a left-side view, (b) is a front view, (c) is a top view, (d) is a rear view, (e) is a right-side view, and (f) is an enlarged perspective view of Section A in (d)
Figure 4:
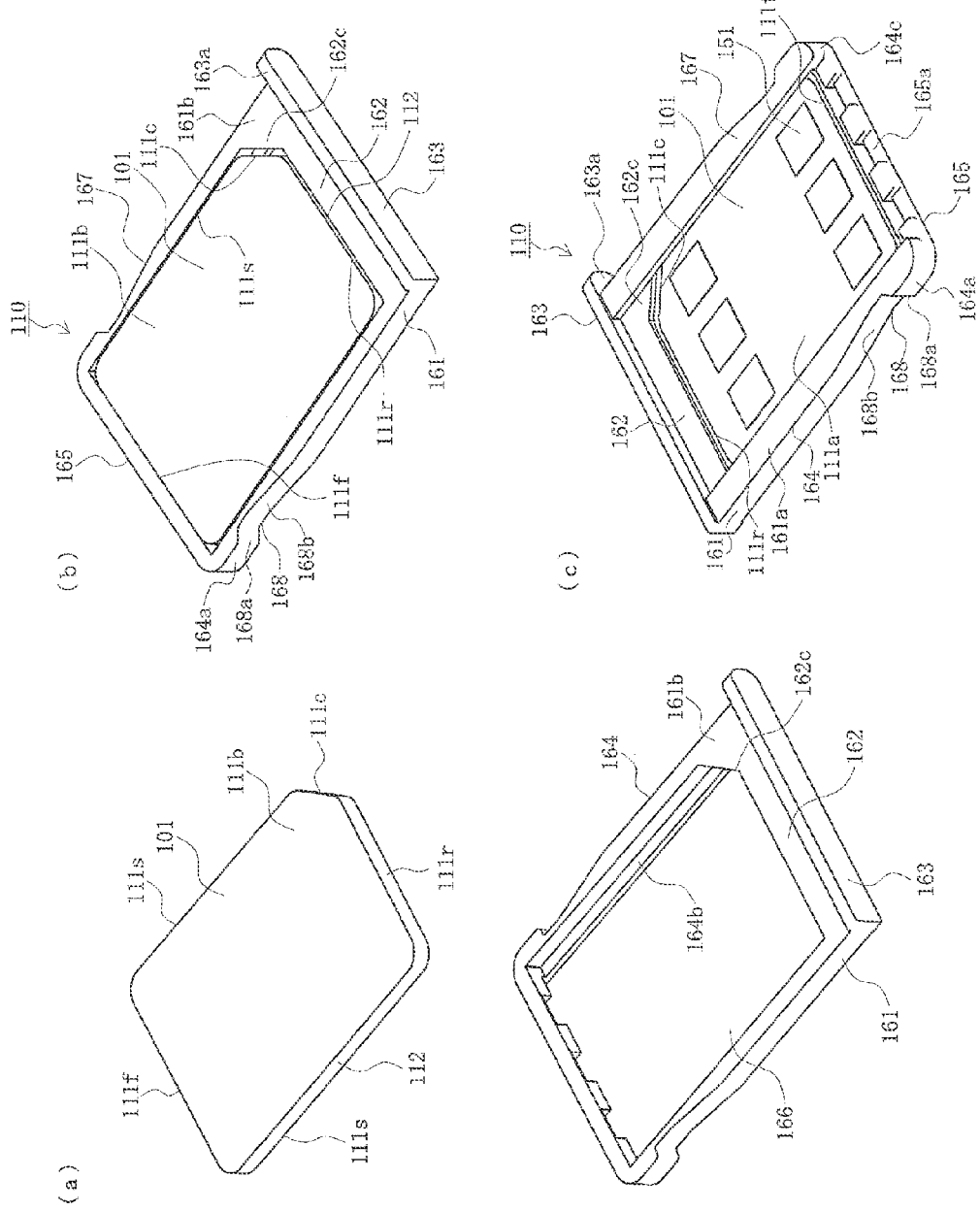
FIG. 4 illustrates multiple views of a card unit in a first embodiment of the Present Disclosure, in which (a) is a view before a card is housed inside the card tray, (b) is a first perspective view of the card tray housing a card, and (c) is a second perspective view of the card tray housing a card.

Referring to FIGS. 1-4, 1 is the connector serving as the device connector in the present embodiment. An electronic device (not shown) is mounted in this connector. Also, 110 is a card unit serving as the device inserted into and held by the connector 1. The card unit 110 can be any type of memory card, and may also be a card adapter having a shape and dimensions suitable for insertion into the connector 1 in order to house a memory card. In addition, it may be a card tray having a shape and dimensions suitable for insertion into the connector 1 in order to house a memory card. In summary, the card unit 110 may be any device that can be inserted into the connector 1 and that can establish an electrical connection with an electronic device via the connector 1. For the sake of convenience, the card unit 110 in the explanation of the present embodiment is a card tray 161 housing and holding a card 101 as shown in FIG. 4. In the explanation of the present embodiment, the card is a $4^{th}$ Form Factor (4FF) card or so-called nanoSIM card.

As shown in FIG. 4, the card 101 has a substantially rectangular shape, and contact pads 151 serving as the electrode pads or terminal members are arranged in rows along the front end 111f and the rear end 111r on the bottom surface 111a. In the example shown, there are two rows of three pads each. In other words, the contact pads 151 are arranged in two rows extending in the width direction of the card 101. Contact pads 151 are not provided in the top surface 111b on the side opposite the bottom surface 111a. A notched portion 111c, which is notched on an inclined angle, is formed on either the right or the left side of the rear end 111r connected to the side edge 111s, more specifically, in the rear right corner of the bottom surface 111a.

Here, the card tray 161 is an integrally formed member obtained by punching and bending a conductive metal plate, and includes a substantially rectangular shaped frame member 167 surrounding the four corners of a space portion 166 serving as the card housing space for housing the card 101. The frame member 167 includes a rear frame portion 162 and a front frame portion 165 which extend parallel to each other in the width direction, and a pair of left and right side frame portions 164 extending in the length direction and connected to both ends of the rear frame portion 162 and both ends of the front frame portion 165. A rear plate portion 163 is integrally formed in the rear surface of the rear frame portion 162.

The space portion 166 is a substantially rectangular space through which the card tray 161 passes from the top surface 161b to the bottom surface 161a. The four corners of this space are demarcated by the rear frame portion 162, the front frame portion 165, and the side frame portions 164. The side surfaces 112 of a card 101 housed inside the space portion 166 are surrounded by the frame member 167 with the rear frame portion 162, the front frame portion 165, and the side frame portions 164 facing the inside surfaces. Overhanging sections 164b opposing each other extend from the side edges of the bottom surface 161a of the card tray 161 on the inner surfaces of the pair of side frame portions 164. The pair of left and right overhanging sections 164b extends in the length direction and function as a card supporting unit that supports the card 101 housed inside the space portion 166 near the left and right side edges of the bottom surface 111a. The amount by which the overhanging sections 164b protrude from the inner surfaces of the side frame portions 164 is slight so that they do not interfere with the contact pads 151 arranged on the bottom surface 111a of the card 101.

The dimension of the rear plate portion 163 in the thickness direction of the card tray 161 is greater than that of the rear frame portion 162, the front frame portion 165, and the side frame portions 164. A protruding portion 163a is formed on at least both ends of the rear plate portion 163 which protrude in the width direction of the card tray 161. In this way, the rear plate portion 163 prevents improper insertion into the connector 1 when the card tray 161 is oriented backwards in the length direction. In other words, it makes it easier for the user of the connector 1 to grip and manipulate the card tray 161.

The dimension of the frame member 167 in the thickness direction of the card tray 161 is greater, in sequential order, in the front frame portion 165, the rear frame portion 162, and the side frame portions 164. However, this is formed so as to be flush with the top surface 161b of the card tray 161. Preferably, the top surface 161b of the card tray 161 is substantially flush with the top surface 111b of the card 101 housed inside the space portion 166.

An inclined portion 162c is formed in a corner of the rear frame portion 162 connected to the side frame portion 164, more specifically, the right rear corner. The inclined portion 162c functions as a card orientation restricting portion. More specifically, the inclined portion 162c is formed so that it approaches and faces the notched portion 111c of a card 101 housed inside the space portion 166 with the proper orientation.

When viewed from the front, the front end surface 164c of the side frame portions 164 forms a protruding portion which protrudes towards the bottom surface 161a on both end of the front frame portion 165. In other words, when viewed from the front, the card tray 161 has a crown shape. In this way, the protruding portions prevent improper insertion into the connector 1 when the card tray 161 is upside down. In other words, it makes it easier to grip and manipulate the card tray 161. When viewed from the front, a recessed portion 165a is preferably formed in the front frame portion 165 at the locations corresponding to each contact pad 151 of the card 101; more specifically, at the locations corresponding to the contact portions 51c of the terminals 51. Because the surface of the recessed portions 165a on the bottom surface 161a side is sufficiently lower than the bottom surface 111a of the card 101 housed and held inside the space portion 166, the front frame portion 165 is reliably prevented from making contact with the terminals 51 when the card tray 161 is inserted into the connector 1.

A holding recessed portion 168 is also formed near the front end on the outer surface of each of the side frame portions 164 to hold the card tray 161 inside the connector 1. The holding recessed portions 168 include a front inclined surface 168a whose angle of inclination is sharp relative to the outer surface of the side frame portion 164, and a rear inclined surface 168b whose angle of inclination relative to the outer surface is gradual. The front side surface 164a closer to the front end surface 164c than the front inclined surface 168a on the outer surface of the side frame portion 164 is the first portion to come into contact with the first holding member 65 when the card tray 161 is inserted into the connector 1.

In the card tray 161 of the present embodiment, the card 101 is housed inside the space portion 166 passing between the top surface 161b and the bottom surface 161a, and surrounding the side surfaces 112 of the card 101. This structure does not cover either the bottom surface 111a or the top surface 111b. As a result, the dimensions can be reduced in the thickness direction. This allows the height of the connector 1 to be reduced. Because this is made of metal, sufficient strength can be maintained even when the dimensions are reduced in the length direction and the width direction. This allows the size of the connector 1 to be reduced. The card tray 161 may be molded out of a material such as a synthetic resin or ceramic, but a metal material that has been punched out and bent is preferred because it is stronger than a resin.

In the present embodiment, the connector 1 has a housing 11 integrally molded from an insulating material such as a synthetic resin, and a shell 61 serving as the cover member mounted on top of the housing 11 which is integrally formed by punching and bending a conductive metal plate. The shell 61 covers at least the housing 11 and the portion of the card tray 161 in which the connector 1 has been inserted. The connector 1 has a relatively flat rectangular solid shape, is mounted in an electronic device, and is configured so a card tray 161 is inserted into or ejected from the housing 11 via a rear insertion slot 18 (from the bottom in FIG. 3 (c)). More specifically, the card tray 161 is inserted into the space formed between the housing 11 and the shell 61.

In the present embodiment, the front end of the connector 1 in the insertion direction of the card tray 161 (upward in FIG. 3 (c)) is referred to as the front end portion 1F, and the rear end in the insertion direction (downward in FIG. 3 (c)) is referred to as the rear end portion 1R. As shown in the drawing, the housing 11 has a bottom wall portion 11b which is a substantially rectangular plate member, and an inner wall portion 11a extending along the front end portion 11f, or the front end of the housing 11 in the insertion direction of the card tray 161, and standing erect from the bottom wall portion 11b. The rear end portion of the housing 11 in the insertion direction of the card tray 161 is referred to as the rear end portion 11r.

Here, the bottom wall portion 11b includes terminal-holding recessed portions 11c for holding the terminals 51 serving as the connection terminals. The terminal holding recessed portions 11c are openings passing through the bottom wall portion 11b in the thickness direction, and are arranged in rows extending in the width direction of the housing 11. In the example shown in the drawing, there are two rows of three recessed portions. In other words, the terminal holding recessed portions 11c and terminal 51 held inside each one of the terminal holding portions 11c are arranged in two rows extending in the width direction of the housing 11.

At least some of the base portions 51a of the terminals 51 are embedded in the bottom wall portion 11b, and the other portions remain exposed inside the terminal holding recessed portions 11c. More specifically, the terminals 51 are embedded in and held by the bottom wall portion 11b using so-called overmolding. Here, the housing 11 is molded by filling a mold cavity in which the terminals 51 have been set with an insulating material so that at least the base portions 51a are covered with the insulating material constituting the bottom wall portion 11b.

Each terminal 51 has cantilevered contact arm portion 51b connected at the base ends to the base portion 51a, and a contact portion 51c connected to the tip or free end of the contact arm portion 51b. The contact arm portion 51b has a substantially M-shaped or W-shaped profile when viewed from above with the base ends connected to the base portion 51a. More specifically, each contact arm portion 51b has a pair of left and right arm portions 51b1 having a substantially U-shaped or J-shaped profile when viewed from above, and a merged portion 51b2 on which the left and right arm portions 51b1 converge and are connected. The contact portion 51*c* is connected to the free end of the merged portion 51*b*2. The top surface of at least the contact portion 51*c* is positioned above the top surface of the bottom wall portion 11*b* when a card 101 housed inside a card tray 161 has not been inserted into the card insertion space.

In each terminal 51, the section of the pair of left and right arm portions 51*b*1 extending towards the front end portion 11*f*, the merged portion 51*b*2, and the section with the contact portion 51*c* have a side profile which rises towards the front end portion 11*f*, that is, extends upward at an angle towards the rear. The contact arm portion 51*b* and the contact portion 51*c* are also positioned inside the terminal holding recessed portion 11*c* when viewed from above.

The terminals 51 are arranged so that each contact portion 51*c* comes into contact with each contact pad 151 on the card 101 inside the card tray 161 held inside the connector 1. Therefore, the number and arrangement of the terminals 51 can be changed to match the number and arrangement of the contact pads 151 on the card 101.

Also, solder tail openings 11*d* are formed in the bottom wall portion 11*b* which pass through the bottom wall portion 11*b* in the thickness direction. The solder tail portions 51*d* are exposed in the solder tail openings 11*d* as the base connecting portion of each terminal 51. Each solder tail portion 51*d* is connected to the base portion 51*a* of each terminal 51 via a connection portion (not shown) embedded in the bottom wall portion 11*b*. Each solder tail portion 51*d* is then connected electrically via solder to a terminal member such as a signal line, contact pad or terminal formed on the circuit board of the electronic device.

The housing 11 has a pair of side wall portions 11*e* extending in the length direction along the side edges, and a tray ejecting rod housing portion 11*g* is formed inside one of the side wall portions 11*e*. There is an ejection mechanism in the tray ejecting rod housing portion 11*g* for ejecting a card tray 161 inserted into the connector 1. A push rod 22 serving as the rod member in the ejection mechanism can be changed in orientation between a first orientation and a second orientation, and is mounted slidably in the length direction, that is, in the insertion and ejection directions of the card tray 161.

The main body portion 22*a* of the push rod 22 is a substantially linear rod-shaped or band-shaped member that extends in the length direction. An operating piece 23 serving as the operating portion is connected integrally to the rear end portion 22*c* or the protruding end of the main body portion 22*a* which protrudes from the housing 11. The user of the connector 1 operates the operating piece 23 using a finger or via a support member such as a pin or rod. It is a substantially rectangular plate which is substantially bent at a right angle near the rear end of the main body portion 22*a*, and extends in a direction intersecting the insertion and ejection directions of the card tray 161. In the example shown in the drawing, the operating piece 23 tends towards the outside in the width direction of the housing 11. The rear end portion 22*c* is a curved portion bent substantially at a right angle in the boundary portion between the main body portion 22*a* and the operating piece 23. A recessed portion 23*a* may be formed in the rear surface of the operating piece 23 in order to readily engage the top of a support member such as a pin or rod. This recessed portion 23*a* can be omitted if necessary.

Also, a reinforcing portion 24 is integrally connected to a section of the main body portion 22*a* close to the rear end and in front of the rear end portion 22*c* in the insertion direction of the card tray 161. The reinforcing portion 24 includes a plate-shaped reinforcing main body portion 24*a* which is integrally connected to the upper edge of the main body portion 22*a* and extends in a direction intersecting the insertion and ejection directions of the card tray 161, and operating piece supporting portion 25 or rear supporting portion extending from the reinforcing main body portion 24*a* to the rear in the advancing direction of the card tray 161, and a main body supporting portion 26 or front supporting portion extending from the reinforcing main body portion 24*a* to the front in the advancing direction of the card tray 161. By integrally connecting the reinforcing portion 24, the section modulus is greater near the rear end of the main body portion 22*a*, and the portion is less likely to become deformed and does not buckle in the length direction (longitudinal direction).

The reinforcing main body portion 24*a* extends in a direction intersecting the length direction of the operating piece 23 (left to right in FIG. 3(*d*)). More specifically, a plate-shaped member extending upward from the upper edge of the main body portion 22*a* is bent at an acute angle in a curved portion 22*d*, and extends downward and outward at an angle in the length direction of the housing 11. The tip (free end) of the reinforcing main body portion 24*a*, as shown in FIG. 3(*a*), is positioned near the middle between the upper edge and the lower edge of the main body portion 22*a* when viewed from the side.

As a result, the supporting end 25*a* positioned on the rear end of the operating piece supporting portion 25 extending from the reinforcing main body portion 24*a*, as shown in FIG. 3(*f*), extends in a direction intersecting the length direction of the operating piece 23, and approaches or abuts the front surface of the operating piece 23 between the upper edge and the lower edge of the operating piece 23, that is, in the range including the middle of the operating piece 23 in the width direction. Also, the supporting end 25*a* approaches or abuts the front surface of the operating piece 23 in at least a portion of the range closer to the end than the middle in the length direction of the operating piece 23. Preferably, the front surface of the operating piece 23 is approached or abutted in a position corresponding to the recessed portion 23*a*.

In this way, when the user exerts a significant amount of operating force and the operating piece 23 is pushed forward in the advancing direction of the card tray 161, at least a portion of the operating piece 23 is supported on the bottom side by the supporting end 25*a* of the operating piece supporting portion 25, despite any deformation of the operating piece 23, in a range including the middle in the width direction on the front surface side, and in a range closer to the front end than the middle in the length direction. This effectively suppresses deformation of the operating piece 23, and prevents deformation of the rear end portion 22*c* of the main body portion 22*a*, which is a bend portion.

The main body supporting portion 26 is substantially hook-shaped when viewed from above. The inner end 26*a* corresponding to the tip of the hook approaches or abuts the outer surface of the main body portion 22*a* of the push rod 22, and the front side end 26*b* corresponding to the front end in the insertion direction of the card tray 161, as shown in FIG. 2, approaches or abuts the side wall portion 11*e*, which is the supporting end of the housing 11, and the rear end 63*b* of the side plate portion 63, which is the supporting end of the shell 61, when the ejection mechanism is in the first orientation.

Figure 1:
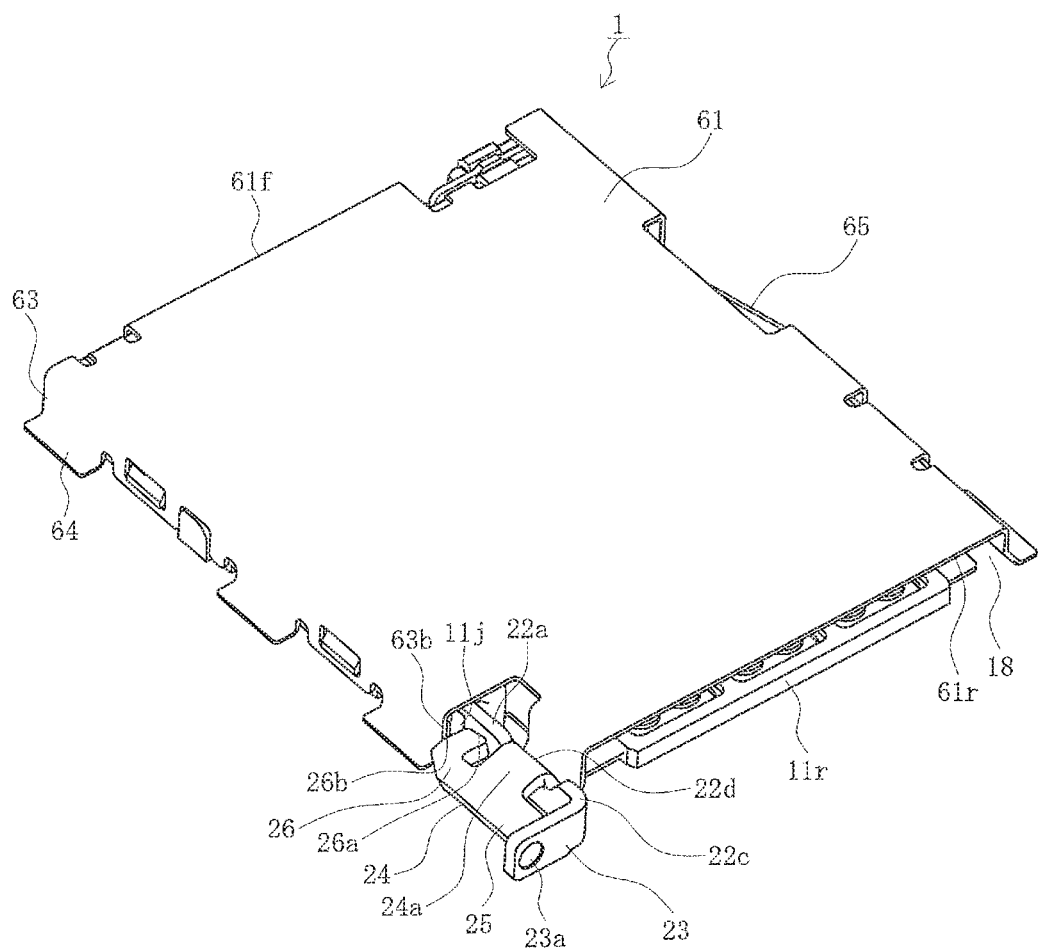
FIG. 1 is a perspective view of a connector in a first embodiment of the Present Disclosure.

As shown in FIGS. 1-3, initially, before a card tray 161 has been inserted, the push rod 22 is pushed farthest in towards the front of the housing 11 in the insertion direction of the card tray 161. In other words, the push rod 22 protrudes the least from the rear end 11*j* of the side wall portion 11*e* of the housing 11 and the rear end 63*b* of the side plate portion 63 of the shell 61. The length of the reinforcing portion 24 from the supporting end 25*a* of the operating piece supporting portion 25 to the front side end 26*b* of the main body supporting portion 26, or the dimension in the length direction, can be established so as to match the amount of forward protrusion by the push rod 22 in the initial state.

Here, the main body supporting portion 26 extends from the reinforcing main body portion 24*a* downward and forward in the advancing direction of the card tray 161. As a result, the front side end 26*b* of the main body supporting portion 26 extending from the reinforcing main body portion 24*a* extends in a direction intersecting the directions of extension for the rear end 11*j* of the side wall portion 11*e* of the housing 11 and the rear end 63*b* of the side plate portion 63 of the shell 61, and approaches or abuts rear ends 11*j* and 63*b* near the middle between the side wall portion 11*e* of the housing 11 and the side plate portion 63 of the shell 61 in the vertical direction when viewed from the side. Therefore, when the user exerts a large amount of operating force and the operating piece 23 is pressed forward in the advancing direction of the card tray 161, the operating force is supported by the rear end 11*j* of the side wall portion 11*e* of the housing 11 and the rear end 63*b* of the side plate portion 63 of the shell 61 via the operating piece 23 and the reinforcing portion 24. This effectively suppresses displacement of the operating piece 23 and the reinforcing portion 24, and effectively prevents deformation of the main body portion 22*a* and the operating piece 23.

Because the main body supporting portion 26 extends from the reinforcing main body portion 24*a* downward and forward at an angle in the advancing direction of the card tray 161, the inner end 26*a*, as shown in FIG. 3(*f*), approaches or abuts the outer surface of the main body portion 22*a* of the push rod 22 in a range from near the upper end to near the middle. Therefore, when the user exerts a large amount of operating force and the operating piece 23 is pushed forward in the advancing direction of the card tray 161, the operating force is supported by the outer surface of the main body portion 22*a* in a wide vertical range via the operating piece 23 and the reinforcing portion 24. This effectively suppresses deformation of the operating piece 23 and the reinforcing portion 24, and effectively prevents deformation of the main body portion 22*a* and the operating piece 23.

Also, an engaging portion 22*b* is formed near the front end of the main body portion 22*a* of the push rod 22 to engage the force input portion 21*b* of the ejection lever 21. The ejection lever 21 serves as the tray ejecting lever of the tray ejecting mechanism, and is a lever-shaped member arranged near the inner wall portion 11*a*. Therefore, the ejection lever 21 is mounted on the bottom wall portion 11*b* so as to be able to pivot on a fulcrum portion 21*c*. The force input portion 21*b* and the portion at the opposite end of the ejection lever 21, between which the fulcrum portion 21*c* is interposed, abut the card tray 161 inserted into the connector 1, and function as a force output portion 21*a* applying force to the card tray 161 in the direction of ejection.

A second holding member 85, which is a holding spring portion used to hold a card tray 161 inserted into the connector 1, is housed inside the tray ejecting rod housing portion 11*g*. The second holding member 85 is a band-shaped member consisting of a metal plate with spring action. The base end is fixed by a fixing member provided in the housing 11, and the tip or free end is a cantilevered member which can be elastically displaced in the width direction of the housing 11. The second holding member 85 has a holding protrusion portion 85*a* which is oriented so the free end faces the front end portion 11*f* and the free end is positioned further inside than the base end in the width direction of the housing, and the holding member protrudes inward in the width direction of the housing 11 near the free end. The second holding member 85 can be omitted if necessary.

The shell 61 has a substantially rectangular top plate portion 62, and side plate portions 63 standing erect from the side edge of the top plate portion 62. A plurality of latching openings 63*a* are formed in the side plate portions 63. When the shell 61 is mounted on the housing 11, latching protrusions 13 formed in the outer surface of the side wall portion 11*e* of the housing 11 become latched in the latching openings 63*a*, and this secures the shell 61 to the housing 11. Also, a solder tail portion 64 is formed at a spot on the lower end of the side wall portions 63, and this serves as a substrate connecting portion standing erect from the side plate portions 63 and extends to the outside in the width direction of the shell 61. The solder tail portion 64 is secured using solder to a fixing pad formed, for example, on the surface of a circuit board in an electronic device. Because at least one fixing pad is connected to the grounding line of the circuit board, the shell 61 is grounded. The front end and rear end of the shell 61 in the insertion direction of the card tray 161 are referred to as the front end portion 61*f* and the rear end portion 61*r*.

A first holding member 65 is formed in either the left or right side plate portion 63, more specifically, in the side plate portion 63 on the opposite side from the tray ejecting rod housing portion 11*g* housing the second holding member 85, and this serves as a holding spring portion for holding a card tray 161 inserted into the connector 1. The first holding member 65 is a plate-shaped member with spring action formed by forcibly bending an end of the side plate portion 63 inward in the width direction of the shell 61. The tip or free end is a cantilevered member that is elastically displaceable in the width direction of the shell 61, that is, in the width direction of the housing 11. The first holding member 65 is oriented so that the base end is connected to a side plate portion 63, and the free end faces the front end portion 61*f* and is positioned to the inside of the base end in the width direction of the housing 11. A holding protrusion portion 65*a* is formed near the free end which protrudes towards the inside in the width direction of the housing 11.

The connector 1 also has a detection switch terminal for detecting a card tray 161 that has been inserted into the connector 1. More specifically, a tray detection switch terminal is arranged near the front end portion 11*f* of the housing 11 in order to detect the inserted card tray 161 at a predetermined location (the location at which the card tray 161 is held by the first holding member 65 and the second holding member 85, and the contact portion 51*c* of each terminal 51 has come into contact with the corresponding contact pad 151 when a card 101 is housed inside the card tray 161). The tray detecting switch is formed with a first contact point member 57, which is a cantilevered terminal mounted on or near the front end portion 11*f*, and a second contact point member 58, which is a terminal held in a switch holding recess 11*i* formed in the bottom wall portion 11*b*. The switch holding recess 11*i* is an opening which passes through the bottom wall portion 11*b* in the direction of thickness.

The first contact member 57 has a mounted portion mounted on the front end portion 11*f* and partially protruding forward from the front end portion 11f, a cantilevered main body portion 57b whose base end is connected to the mounted portion and which protrudes horizontally, and a contact portion 57c connected to the tip or free end of the main body portion 57b. The mounted portion is substantially parallel to the side surface of the inner wall portion 11a, and the main body portion 57b is inclined with respect to the side surface of the inner wall portion 11a and the contact portion 57c protrudes forward towards the front end portion 11b when a card tray 161 has not been inserted into the connector 1. When a card tray 161 has been inserted, the front frame portion 165 of the card tray 161 abuts the free end of the main body portion 57b. The second contact member 58 has a mounted portion most of which is embedded in the bottom wall portion 11b and some of which protrudes forward from the front end portion 11f, and a contact portion 58b whose base end is connected to the mounted portion, and whose tip or free end at least is exposed inside the switch holding recessed portion 11i.

Because the contact portion 57c of the first contact member 57 does not come into contact with the contact portion 58b of the second contact member 58, as shown in FIG. 2, when a card tray 161 has not been inserted, the first contact member 57 and the second contact member 58 do not come into contact with each other; that is, the terminals do not come into contact with each other, and the card detecting switch is turned Off. However, when a card tray 161 is inserted into the connector 1 and reaches a predetermined position, the free end of the main body portion 57b of the first contact member 57 is deformed and pushed towards the front end portion 11f by the front frame portion 165 of the card tray 161, and the contact portion 57c of the first contact member 57 comes into contact with the contact portion 58b of the second contact member 58. Thus, the first contact member 57 and the second contact member 58 come into contact with each other; that is, the terminals come into contact with each other, the card detecting switch is turned On, and it is detected that a card tray 161 has reached the predetermined position in the connector 1.

Also, the housing 11 has flange portions 11h extending to the outside in the width direction from both the left and right sides of the bottom wall portion 11b. The flange portions 11h are plate members that are thinner than the bottom wall portion 11b and are formed, as shown in FIG. 3(d) so the bottom surface of the flange portions is substantially flush with the bottom surface of the bottom wall portion 11b. Therefore, the top surface of the flange portions 11h is positioned below the top surface of the bottom wall portion 11b. As a result, the shape of the insertion port 18 formed between the rear end portion 11r of the housing 11 and the rear end portion 61r of the shell 61 not only has a slender rectangular shape whose thickness is uniform in the entire width direction, but is also substantially crown-shaped with protruding portions 18a protruding downward at both ends.

When viewed from the front, as mentioned earlier, the front frame portion 165 of the card tray 161 is substantially crown-shaped with protruding portions at both ends. As a result, the insertion slot 18 works with the front frame portion 165 to prevent improper insertion of the card tray 161 into the connector 1 upside down. In addition, the dimension of the insertion slot 18 in the thickness direction with the exception of the protruding portions 18a is smaller than the dimension of the rear plate portion 163 of the card tray 161 in the thickness direction. Also, the dimension of the insertion slot 18 in the width direction is smaller than the dimension of the rear plate portion 163 of the card tray 161 in the width direction. Therefore, the insertion slot 18 works with the rear plate portion 163 to prevent improper insertion of a card tray 161 into the connector 1 backwards.

Figure 5:
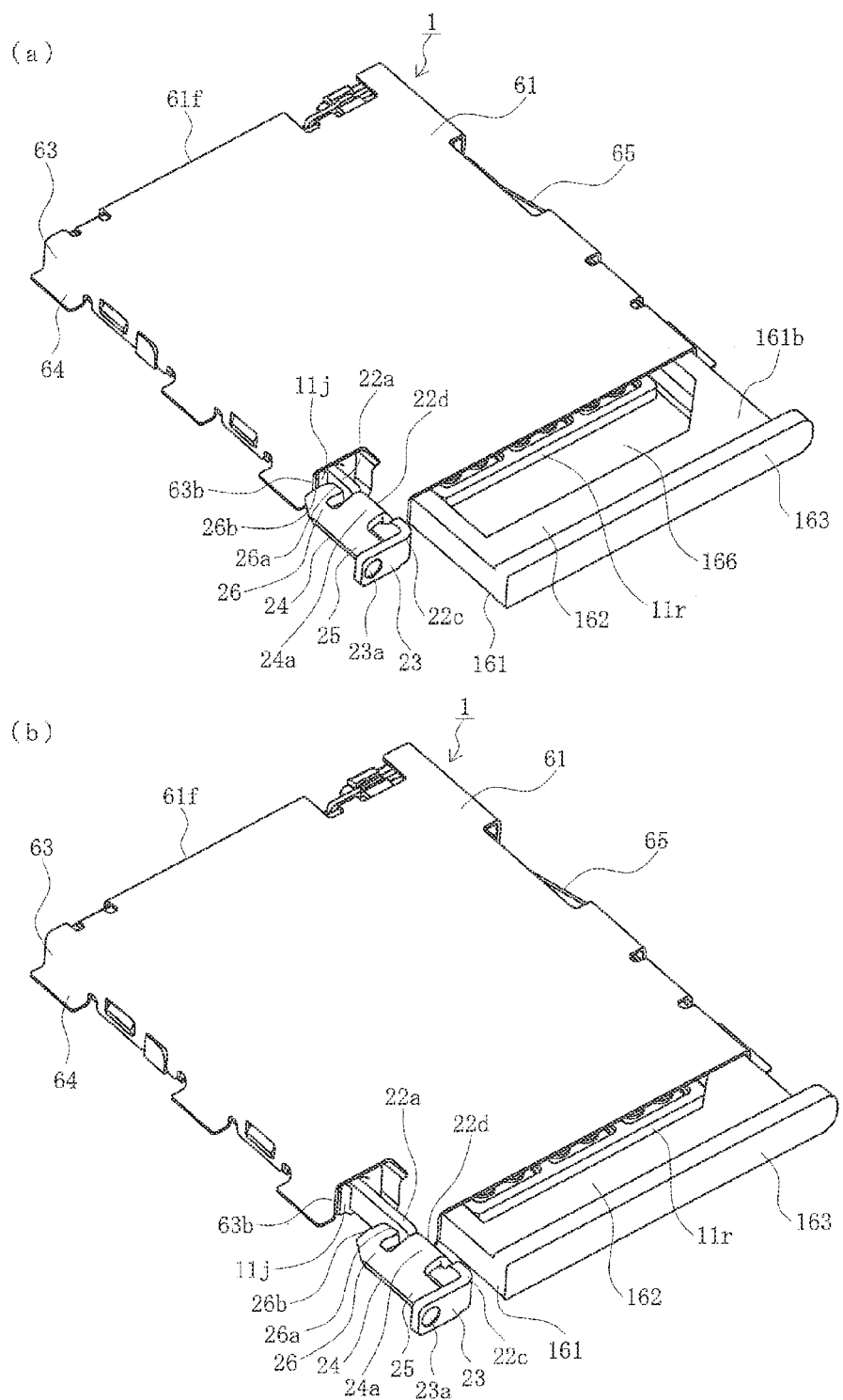
FIG. 5 is a perspective view showing the connector of FIG. 1 before and after a card has been inserted into the card tray, in which (a) is the view before the card has been inserted into the card tray, and (b) is the view after the card has been inserted into the card tray.

Referring to FIG. 5, an explanation of the operation of a connector with this configuration is illustrated. The operations associated with the insertion of a card tray 161 will be explained first. First, a card tray 161, containing a card 101, is inserted from the insertion slot 18 at the rear of the connector 1 into the card insertion space formed between the housing 11 and the shell 61. For the sake of convenience, depiction of the card 101 has been omitted from FIG. 5. In other words, the card tray 161 is not housing a card 101.

When properly inserted, the top surface 161b of the card tray 161 is facing upwards opposite the top plate portion 62 of the shell 61, and the front frame portion 165 is facing the front end portion 1F of the connector 1. When a card 101 is housed inside the card tray 161, the bottom surface 111a in which the contact pads 151 are arranged is facing downward opposite the bottom wall portion 11b of the housing 11 in which the terminals 51 are arranged, and the front end 111f is facing the front end portion 1F of the connector 1.

When the card tray 161 is inserted from the insertion slot 18 into the card insertion space formed between the housing 11 and the shell 61, the side frame portions 164 protrude downward from the bottom surfaces of the front frame portion 165 and the rear frame portion 162 and from the bottom surface 111a of the card 101 housed inside the space portion 166, and are guided by recessed portions formed on the left and right sides of the bottom wall portion 11b in the housing 11 into the card insertion space.

Recessed portions 165a are formed in the front frame portion 165 in positions corresponding to the contact portion 51c of each terminal 51, and the surface of the recessed portions 165a on the bottom surface 161a side are sufficiently lower than the bottom surface 111a of the card 101 housing inside the space portion 166. When the card tray 161 is inserted into the connector 1, contact by the front frame portion 165 with the terminals 51 is reliably prevented.

When the card tray 161 is pushed in further, the front side surface 164a to front end surface 164c of the side frame portions 164 or the front frame portion 165 comes into contact with the holding protrusion portion 65a of the first holding member 65 and the holding protrusion portion 85a of the second holding member 85. The first holding member 65 is a member that is formed integrally with the conductive metal shell 61, and the shell 61 is grounded. As a result, the card tray 161 is grounded when it makes contact with the holding protrusion portion 65a of the first holding member 65. Therefore, static electricity is reliably eliminated via the card tray 161.

Initially, before the card tray 161 has been inserted, as shown in FIG. 3(d), the holding protrusion portion 65a of the first holding member 65 and the holding protrusion portion 85a of the second holding member 85 protrude significantly into the card insertion space in the width direction. Therefore, the holding protrusion portion 65a of the first holding member 65 and the holding protrusion portion 85a of the second holding member 85 make reliable contact with a card tray 161 inserted into the card insertion space.

When the card tray 161 is pushed in even further, the interval between the holding protrusion portion 65a of the first holding member 65 and the holding protrusion portion 85a of the second holding member 85 is pushed apart, and the holding protrusion portion 65a of the first holding member 65 and the holding protrusion portion 85a of the second holding member 85 move to the rear relative to the card tray 161 along the front side surface 164a of the side frame portions 164. Also, the first contact member 57, which is a card detection switch terminal, makes contact with the card tray 161, and the ejection lever 21 also makes contact with the card tray 161. More specifically, the front frame portion 165 makes contact with the free end of the main body portion 57b of the first contact member 57 and the force output portion 21a of the ejection lever 21.

Then, when the card tray 161 is pushed in even further, the card tray 161 reaches a predetermined position in the connector 1 as shown in FIG. 5(b). At this time, it is pressed into the front frame portion 165, the free end of the main body portion 57b of the first contact member 57 is displaced in the direction of the front end portion 11f, and the contact portion 57c of the first contact member 57 comes into contact with the contact portion 58b of the second contact member 58. Because the first contact member 57 and the second contact member 58 come into contact in this way, the card detection switch is turned On, and the card tray 161 reaching the predetermined position in the connector 1 is detected.

Also, the ejection mechanism is changed to the second orientation by the card tray 161 that has advanced to the predetermined position in the connector 1. More specifically, the force output portion 21a of the ejection lever 21 pushes into the front frame portion 165 and is displaced in the direction of the front end portion 11f. As a result, the force input portion 21b of the ejection lever 21 is displaced towards the rear end portion 11r. As a result, the push rod 22 with the engaging portion 22b engaging the force input portion 21b slides in the direction of the rear end portion 11r and, as shown in FIG. 5(b), the amount by which it protrudes forward from the rear end 11j of the side wall portions 11e of the housing 11 and from the rear end 63b of the side plate portion 63 of the shell 61 is greater than in the initial state shown in FIG. 5(a). More specifically, the front side end 26b of the main body supporting portion 26 at the front end of the reinforcing portion 24 is separated further from the rear end 11j of the side wall portions 11e of the housing 11 and the rear end 63b of the side plate portions 63 of the shell 61.

When the card tray 161 reaches the predetermined position in the connector 1, the holding protrusion portion 65a of the first holding member 65 and the holding protrusion portion 85a of the second holding member 85 also move forward and engage the holding recessed portions 168 of the left and right side frame portions 164. This locks and secures the card tray 161 at the predetermined position in the connector 1.

When a card 101 is housed inside the card tray 161, the card 101 is secured in the predetermined position along with the card tray 161, and data is exchanged with a computing means in the electronic device containing the connector 1. When the card 101 is secured in the predetermined position, the contact portion 51c of each terminal 51 in the connector 1 comes into contact with a contact pad 151 on the card 101 and establishes an electrical connection.

However, when the electronic device contains a connector other than connector 1, connector 1 may not be needed. At this time, the card tray 161 can be inserted into the connector 1 without a card 101; that is, the empty card tray 161 can be inserted for storage purposes. Because a recessed portion 165a is formed in the front frame portion 165 of the card tray 161, the front frame portion 165 cannot abut the terminals 51 and damage the terminals 51, even when a card tray 161 is inserted into the connector 1 without a card 101.

Regarding the ejection of a card tray 161 from the connector 1, when the operating piece 23 on the push rod 22 is pushed in, the force input portion 21b of the ejection lever 21 engaged with the engaging portion 22b of the push rod 22 is displaced in the direction of the front end portion 11f. As a result, the front frame portion 165 is pushed by the force output portion 21a of the ejection lever 21, and the card tray 161 is displaced from the predetermined position in the direction of the rear end portion 11r. Because the card tray 161 is locked and secured in the predetermined position when the holding protrusion portion 65a of the first holding member 65 and the holding protrusion portion 85a of the second holding member 85 are inserted into and engage the holding recessed portions 168 of the left and right side frame portions 164, sufficient force has to be applied to the front frame portion 165 from the force output portion 21a of the ejection lever 21, and sufficient force has to be applied from the push rod 22 to the force input portion 21b in order to release the lock. However, because the pushing force is sufficiently large, it is easily unlocked when the operating piece 23 of the push rod 22 is pushed, and the card tray 161 is displaced from the predetermined position in the direction of the rear end portion 11r.

At this time, the operating piece 23 applies sufficient force in the advancing direction of the card tray 161. However, because the reverse side, that is, the front surface side of the operating piece 23 is supported by the supporting end 25a of the operating piece supporting portion 25 even when the operating piece 23 is displaced, displacement of the operating piece 23 is effectively suppressed, and deformation of the rear end portion 22c of the main body portion 22a, which is a curved portion, is prevented.

When viewed from above, the operating piece 23 is positioned to the outside of the main body portion 22a of the push rod 22 in the width direction of the housing 11. Therefore, the portion of the main body portion 22a of the push rod 22 protruding to the outside from the housing 11 is subjected to a bending moment by the force exerted on the operating piece 23. However, because the reinforcing portion 24 is integrally connected to the main body portion 22a, the main body portion 22a has a large section modulus and is less likely to deform or buckle in the length direction (longitudinal direction). Also, because the inner end 26a of the main body supporting portion 26 of the reinforcing portion 24 approaches or abuts the outer surface of the main body portion 22a, deformation of the main body portion 22a and the operating piece 23 is effectively prevented.

When the user pushes in the push rod 22 to the maximum possible forward position, the ejection mechanism returns to the first orientation. As a result, the force output portion 21a of the ejection lever 21 is displaced to a position closer to the rear end portion 11r than to the free end of the main body portion 57b of the first contact member 57. The rear plate portion 163 of the card tray 161 then protrudes sufficiently from the insertion slot 18 of the connector 1. Therefore, the rear plate portion 163 can be grasped to pull the card tray 161 out of the connector 1. Because the card tray 161 makes contact with the holding protrusion portion 65a of the first holding member 65, static electricity is removed. The static electricity flows to the first contact member 57, and the card detection switch sustains the effect of the static electricity.

When the push rod 22 is pushed in with excessive force, the ejection mechanism returns to the first orientation, the ejection lever 21 and the engaging portion 22b forcibly stop the push rod 22 which is engaged with the force input portion 21b of the ejection lever 21, and the main body portion 22a and the operating piece 23 sustain a large force. However, because the front side end 26b of the main body supporting portion 26 extending from the reinforcing main body portion 24a approaches or abuts the rear end 11j of the side wall portions 11e of the housing 11 and the rear end 63b of the side plate portion 63 of the shell 61 in the first orientation, deformation of the main body portion 22a and the operating piece 23 is effectively prevented.

In the present embodiment, the connector 1 includes a housing 11 into which a card unit 110 is inserted and from which it is ejected, and an ejection mechanism which is able to change orientation between a first orientation and a second orientation. The ejection mechanism includes a push rod 22 which is able to slide in the insertion and ejection directions of the card unit 110. The push rod 22 includes a main body portion 22a extending in the insertion and ejection directions of the card unit 110, an operating piece 23 connected to the rear end portion 22c of the main body portion 22a protruding from the housing 11 and extending in a direction intersecting the insertion and ejection directions of the card unit 110, and a reinforcing portion 24 connected to the main body portion 22a in front of the rear end portion 22c in the insertion direction of the card unit 110 and able to support the operating piece 23 from the front in the insertion direction of the card unit 110. The reinforcing portion 24 includes a supporting end 25a extending in a direction intersecting the length direction of the operating piece 23 so that the supporting end 25a is able to support the operating piece 23 from the front in the insertion direction of the card unit 110. The amount by which the rear end portion 22c protrudes from the housing 11 is greater when the ejection mechanism is in the second orientation than when the ejection mechanism is in the first orientation.

In this way, force is applied to the operating piece 23 forward in the insertion direction of the card unit 110, and the reverse side, that is, front surface side of the operating piece 23 is supported by the supporting end 25a of the reinforcing portion 24 even when the operating piece 23 is displaced. As a result, displacement of the operating piece 23 is effectively suppressed, and deformation of the rear end portion 22c of the main body portion 22a and the operating piece 23 is prevented. Therefore, operation of the ejection mechanism is more reliable and card units 110 can be ejected more reliably even when the mechanism is used repeatedly over a long period of time.

Also, the supporting end 25a is able to support the middle of the operating piece 23 in the width direction. Therefore, even when force is applied to the operating piece 23 forward in the insertion direction of the card unit 110, displacement of the operating piece 23 is effectively suppressed, and deformation of the operating piece 23 and the rear end portion 22c of the main body portion 22a connected to the operating piece 23 is prevented.

The supporting end 25a is also able to support at least a portion of the operating piece 23 in a range from the middle to the tip in the length direction. Therefore, even when force is applied to the operating piece 23 forward in the insertion direction of the card unit 110, displacement of the operating piece 23 is effectively suppressed, and deformation of the operating piece 23 and the rear end portion 22c of the main body portion 22a connected to the operating piece 23 is prevented.

In addition, the reinforcing portion 24 includes a plate-shaped reinforcing main body portion 24a which is connected to the main body portion 22a, extends in the insertion and ejection directions of the card unit 110, extends in a direction intersecting the insertion and ejection directions of the card unit 110, and extends in a direction intersecting the length direction of the operating piece 23. Therefore, because the sectional module of the main body portion 22a is high, the main body portion 22a is unlikely to be deformed and buckle even when force is applied to the operating piece 23 forward in the insertion direction of the card unit 110.

The connector 1 also has a shell 61 which is mounted on the housing 11 and covers at least the housing 11 and a portion of the card unit 110 inserted into the housing 11. The reinforcing portion 24 includes a front side end 26b which is supported forward in the insertion direction of the card unit 110 by the rear end 11j of the side wall portions 11e of the housing 11 and the rear end 63b of the side plate portion 63 of the shell 61. This front side end 26b extends in a direction intersecting the direction of extension by the rear end 11j of the side wall portions 11e of the housing 11 and the rear end 63b of the side plate portion 63 of the shell 61. Therefore, even when force is applied to the operating piece 23 forward in the insertion direction of the card unit 110 and the ejection mechanism suddenly shifts from the second orientation to the first orientation, the front side end 26b of the reinforcing portion 24 is supported by the rear end 11j of the side wall portions 11e of the housing 11 and the rear end 63b of the side plate portion 63 of the shell 61, and deformation of the main body portion 22a and the operating piece 23 is effectively prevented.

The reinforcing portion 24 also includes an inner end 26a which can be supported by the outer surface of the main body portion 22a in front of the reinforcing main body portion 24a in the insertion direction of the card unit 110. Therefore, even when force is applied to the operating piece 23 forward in the insertion direction of the card unit 110, displacement of the operating piece 23 and the reinforcing portion 24 is effectively suppressed, and deformation of the main body portion 22a and the operating piece 23 is effectively prevented.

The connector 1 also includes a first holding member 65 and a second holding member 85 for housing a card unit 110 inserted into the housing 11. The first holding member 65 and the second holding member 85 include holding protrusion portions 65a, 85a which protrude inward in the width direction of the housing 11, and the card unit 110 includes a holding recessed portion 168 formed on the outer surface. The holding protrusion portions 65a, 85a of the first holding member 65 and the second holding member 85 engage the holding recessed portion 168 to secure the card unit 110. As a result, the card unit 110 cannot be unintentionally removed from the connector 1.

The following is an explanation of a second embodiment of the Present Disclosure. All structures that are identical to those in the first embodiment are denoted by the same reference numbers and further explanation of these structures has been omitted. Explanation of all operations and effects that are identical to those in the first embodiment has also been omitted.

Figure 6:
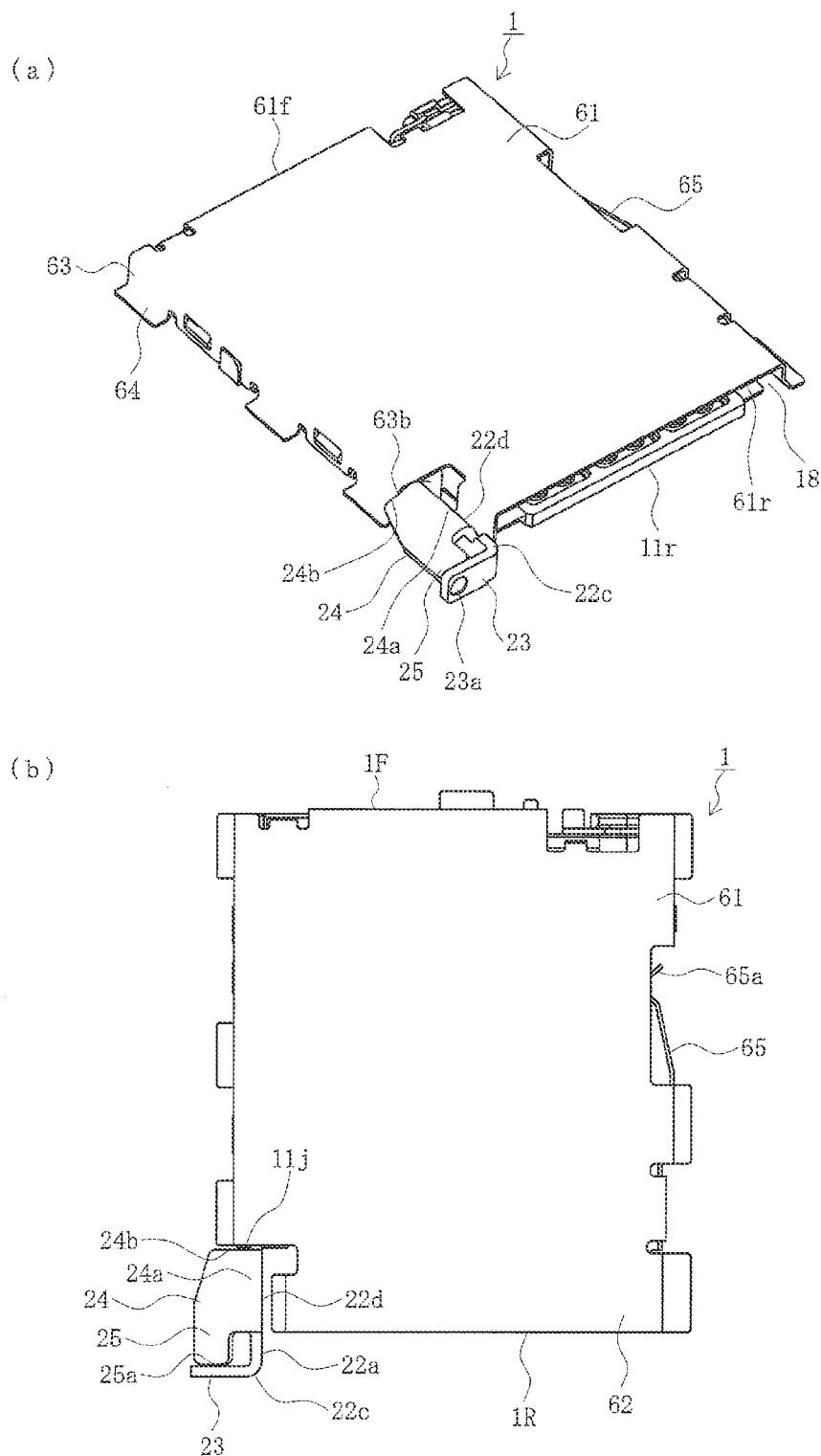
FIG. 6 is a perspective view showing a connector in a second embodiment of the Present Disclosure before a card has been inserted into the card tray, in which (a) is a perspective view, and (b) is a top view.
Figure 7:
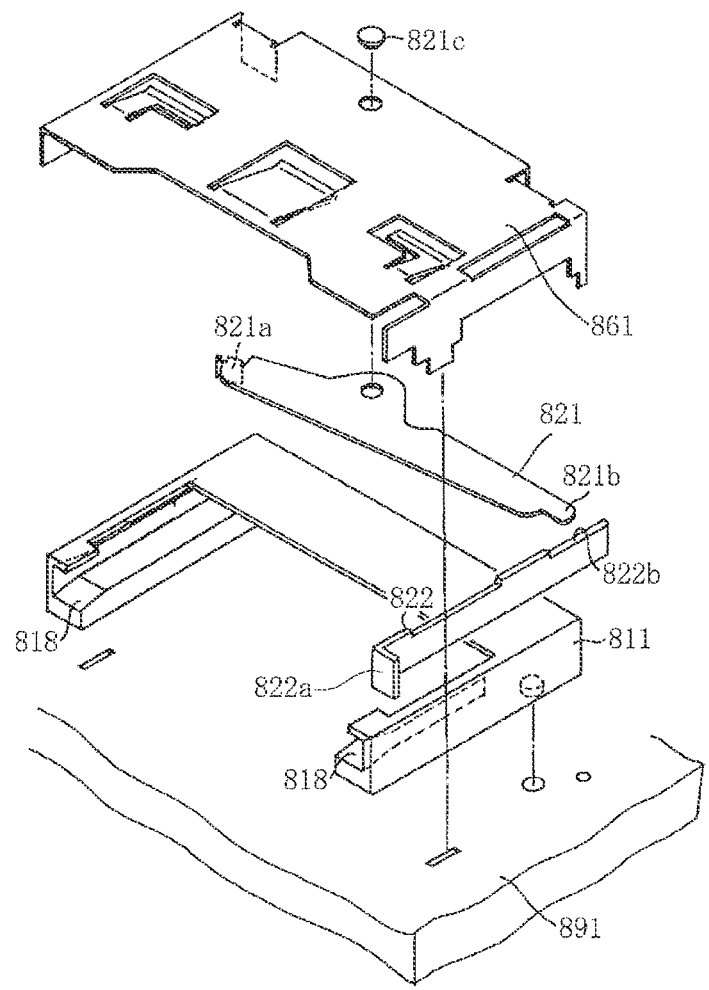
FIG. 7 is a diagram showing a conventional connector.

Referring to FIG. 6, the reinforcing portion 24 of the push rod 22 in the present embodiment does not have a main body supporting portion 26. In other words, the main body supporting portion 26 has been omitted from the reinforcing portion 24 of the push rod 22. Initially, as shown in the drawing, the push rod 22 is pushed into the housing 11 to the furthest point forward in the insertion direction of the card tray 161, and the front side end 24b of the reinforcing portion 24 approaches or abuts the rear end 11j of the side wall portions 11e of the housing 11 and the rear end 63b of the side plate portion 63 of the shell 61.

Thus, when excessive operating force is exerted and the operating piece 23 is pushed forward in the advancing direction of the card tray 161, the operating force is supported near the middle of the rear end 11j of the side wall portions 11e of the housing 11 and the rear end 63b of the side plate portion 63 of the shell 61 in the vertical direction, thereby effectively suppressing displacement of the operating piece 23 and the reinforcing portion 24, and effectively preventing deformation of the main body portion 22a and the operating piece 23.

The dimension of the reinforcing portion 24 in the length direction; that is, the length from the supporting end 25a of the operating piece supporting portion 25 to the front side end 24b of the reinforcing portion 24, can be determined if necessary on the basis of the amount by which the push rod 22 protrudes forward in the initial state.

Because the other aspects of the configuration of the connector 1 are identical to those in the first embodiment, further explanation of these aspects has been omitted. Further, because the operations are also identical to those of the first embodiment, explanation of these has been omitted as well. Further, because a main body supporting portion 26 has been omitted in the present embodiment, the configuration of the reinforcing portion 24 can be simplified. Further, because the dimensions of the reinforcing main body portion 24a and the curved portion 22d of the main body portion 22a can be increased in the length direction, the strength of the reinforcing portion 24 and the main body portion 22a can be improved.

While a preferred embodiment of the Present Disclosure is shown and described, it is envisioned that those skilled in the art may devise various modifications without departing from the spirit and scope of the foregoing Description and the appended Claims.

What is claimed is:

1. A connector, the connector comprising:
a housing for insertion and ejection of a device;
an ejection mechanism able to change orientation between a first orientation and a second orientation, the ejection mechanism including a rod member able to slide in the directions of device insertion and ejection, the rod member including a main body portion extending in the directions of insertion and ejection, and operating piece connected to a protruding end of the main body portion protruding from the housing and extending in a direction intersecting the insert and ejection directions, and a reinforcing portion connected to the main body portion in front of the protruding end in the insertion direction and able to support the operating piece from the front in the insertion direction, the reinforcing portion including a supporting end able to support the operating piece from the front in the insertion direction, the supporting end extending in a direction intersecting the length direction of the operating piece; and
a cover member mounted on the housing and covering at least the housing and a portion of the device inserted into the housing,
wherein the reinforcing portion further includes a front end supportable from the front in the insertion direction by a supporting end of the housing and a supporting end of the cover member when the ejection mechanism is in the first orientation, the front end extending in a direction intersecting the direction of extension of the supporting end of the housing and the supporting end of the cover member;
wherein the amount of protrusion of the protruding end from the housing is greater when the ejection mechanism is in the second orientation than in the first orientation.

2. The connector of claim 1, wherein the supporting end is able to support the middle of the operating piece in the width direction.

3. The connector of claim 1, wherein the supporting end is able to support at least a portion of the operating piece in a range from the middle and towards the front of the operating piece in the length direction.

4. The connector of claim 1, wherein the reinforcing portion further includes a plate-shaped reinforcing main body portion connected to the main body portion, extending in the directions of insertion and ejection, extending in a direction intersecting the directions of insertion and ejection, and extending in a direction intersecting the length direction of the operating piece.

5. A connector, the connector comprising:
a housing for insertion and ejection of a device; and
an ejection mechanism able to change orientation between a first orientation and a second orientation, the ejection mechanism including a rod member able to slide in the directions of device insertion and ejection, the rod member including a main body portion extending in the directions of insertion and ejection, and operating piece connected to a protruding end of the main body portion protruding from the housing and extending in a direction intersecting the insert and ejection directions, and a reinforcing portion connected to the main body portion in front of the protruding end in the insertion direction and able to support the operating piece from the front in the insertion direction, the reinforcing portion including a supporting end able to support the operating piece from the front in the insertion direction, the supporting end extending in a direction intersecting the length direction of the operating piece, the reinforcing portion further including an inner end able to provide support on an outer surface of the main body portion to the front of the reinforcing main body portion in the insertion direction,
wherein the amount of protrusion of the protruding end from the housing is greater when the ejection mechanism is in the second orientation than in the first orientation.

6. The connector of claim 5, wherein the supporting end is able to support at least a portion of the operating piece in a range from the middle and towards the front of the operating piece in the length direction.

7. The connector of claim 5, wherein the reinforcing portion further includes a plate-shaped reinforcing main body portion connected to the main body portion, extending in the directions of insertion and ejection, extending in a direction intersecting the directions of insertion and ejection, and extending in a direction intersecting the length direction of the operating piece.

8. The connector of claim 5, further comprising a cover member mounted on the housing and covering at least the housing and a portion of the device inserted into the housing.

9. The connector of claim 8, wherein the reinforcing portion further includes a front end supportable from the front in the insertion direction by a supporting end of the housing and a supporting end of the cover member when the ejection mechanism is in the first orientation, the front end extending in a direction intersecting the direction of extension of the supporting end of the housing and the supporting end of the cover member.

10. The connector of claim 5, further comprising a holding spring portion for holding the device inserted into the housing, the holding spring portion including a holding protrusion portion extending toward an inside of the housing in the width direction.

11. The connector of claim 10, wherein the device includes a holding recessed portion formed in an outer surface thereof, the holding protrusion portion of the holding spring portion engaging the holding recessed portion to hold the device.

12. A connector, the connector comprising:
a housing for insertion and ejection of a device;
an ejection mechanism able to change orientation between a first orientation and a second orientation, the ejection mechanism including a rod member able to slide in the directions of device insertion and ejection, the rod member including a main body portion extending in the directions of insertion and ejection, and operating piece connected to a protruding end of the main body portion protruding from the housing and extending in a direction intersecting the insert and ejection directions, and a reinforcing portion connected to the main body portion in front of the protruding end in the insertion direction and able to support the operating piece from the front in the insertion direction, the reinforcing portion including a supporting end able to support the operating piece from the front in the insertion direction, the supporting end extending in a direction intersecting the length direction of the operating piece; and
a holding spring portion for holding the device inserted into the housing, the holding spring portion including a holding protrusion portion extending toward an inside of the housing in the width direction.

13. The connector of claim 12, wherein the device includes a holding recessed portion formed in an outer surface thereof, the holding protrusion portion of the holding spring portion engaging the holding recessed portion to hold the device.

14. The connector of claim 12, wherein the reinforcing portion further includes a plate-shaped reinforcing main body portion connected to the main body portion, extending in the directions of insertion and ejection, extending in a direction intersecting the directions of insertion and ejection, and extending in a direction intersecting the length direction of the operating piece.

15. The connector of claim 12, further comprising a cover member mounted on the housing and covering at least the housing and a portion of the device inserted into the housing.

16. The connector of claim 15, wherein the reinforcing portion further includes a front end supportable from the front in the insertion direction by the supporting end of the housing and a supporting end of the cover member when the ejection mechanism is in the first orientation, the front end extending in a direction intersecting the direction of extension of the supporting end of the housing and the supporting end of the cover member.

17. The connector of claim 16, wherein the device includes a holding recessed portion formed in the outer surface, the holding protrusion portion of the holding spring portion engaging the holding recessed portion to hold the device.

18. The connector of claim 12, wherein the supporting end is able to support at least a portion of the operating piece in a range from the middle and towards the front of the operating piece in the length direction.

19. A connector, the connector comprising:
a housing, the housing defining a rearward opening slot for forward insertion and rearward ejection of a device; and
an ejection mechanism, the ejection mechanism configured to be movable between a forward position where the device is ejected from the housing and a rearward position where the device is inserted into the housing, the ejection mechanism including,
a rod member, the rod member extending in the directions of insertion and ejection, the rod member having a rear end, a side surface, and an upper edge,
an operating piece, the operating piece being integrally formed with the rod member, the operating piece being bent from the rear end of the rod member to define forward and rearward surfaces of the operating piece, the operating piece extending in a direction intersecting the directions of insertion and ejection, the operating piece being positioned rearward of the rearward opening slot of the housing, and
a reinforcing portion, the reinforcing portion being integrally formed with the rod member, the reinforcing portion being bent from the upper edge of the rod member proximate to the rear end of the rod member, the reinforcing portion having a forward portion having an inner end which approaches or abuts the side surface of the rod member, the reinforcing portion having a rearward portion having a rear end which approaches or abuts the forward surface of the operating piece.

20. The connector of claim 19, wherein the rod member has an inner side surface which faces the rearward opening slot and an outer side surface, and wherein the inner end of the forward portion of the reinforcing portion approaches or abuts the outer side surface of the rod member.

21. The connector of claim 19, wherein the operating piece has a free end, the free end being positioned distal from the rearward opening slot as compared to the rear end of the rod member.

22. The connector of claim 19, further comprising a cover member mounted on the housing, the rearward opening slot being defined between the housing and the cover member, the cover member having a side plate portion having a rear end, and wherein the forward portion of the reinforcing portion has a forward end which approaches or abuts the rear end of the side plate portion of the cover member.

23. The connector of claim 19, further comprising a holding spring portion for holding the device inserted into the housing, the holding spring portion including a holding protrusion portion extending toward the rearward opening slot, and wherein the device includes a holding recessed portion formed in an outer surface thereof, the holding protrusion portion of the holding spring portion engaging the holding recessed portion to hold the device within the housing.

24. The connector of claim 19, wherein the operating piece is substantially bent at a right angle from the rear end of the rod member.

25. The connector of claim 19, wherein the reinforcing portion is substantially bent at an acute angle from the upper edge of the rod member.

* * * * *